United States Patent [19]

Ichkhan

[11] Patent Number: 4,900,878
[45] Date of Patent: Feb. 13, 1990

[54] CIRCUIT TERMINATIONS HAVING IMPROVED ELECTRICAL AND STRUCTURAL INTEGRITY

[75] Inventor: Elie J. Ichkhan, Manhattan Beach, Calif.

[73] Assignee: Hughes Aircraft Company, Los Angeles, Calif.

[21] Appl. No.: 252,826

[22] Filed: Oct. 3, 1988

[51] Int. Cl.$^4$ .......................... H05K 1/00; H05K 3/00
[52] U.S. Cl. ...................................... 174/258; 29/397; 361/414; 174/259; 174/265; 174/267
[58] Field of Search ...................... 174/68.5, 258, 259, 174/265, 267; 361/397, 398, 414; 29/397

[56] References Cited

U.S. PATENT DOCUMENTS

| | | | |
|---|---|---|---|
| 3,439,109 | 4/1969 | Birt et al. | 174/68.5 |
| 3,471,348 | 10/1969 | Shaheen et al. | 174/68.5 |
| 3,516,156 | 6/1970 | Steranko | 174/68.5 |
| 3,740,678 | 6/1973 | Hill | 361/414 X |
| 3,923,359 | 12/1975 | Newsam | 174/68.5 X |
| 4,150,421 | 4/1979 | Nishihara et al. | 174/68.5 X |
| 4,191,800 | 3/1980 | Holtzman | 174/68.5 X |
| 4,464,704 | 8/1984 | Huie et al. | 361/414 |
| 4,482,937 | 11/1984 | Berg | 361/414 X |
| 4,533,978 | 8/1985 | Walter | 174/68.5 X |
| 4,594,473 | 6/1986 | Inoue et al. | 174/68.5 |
| 4,769,270 | 9/1988 | Nagamatsu et al. | 174/68.5 X |
| 4,791,239 | 12/1988 | Shirahata et al. | 174/68.5 |
| 4,804,575 | 2/1989 | Kohm | 174/68.5 X |
| 4,812,792 | 3/1989 | Leibowitz | 361/414 X |

*Primary Examiner*—Morris H. Nimmo
*Attorney, Agent, or Firm*—William J. Streeter; Wanda K. Denson-Low

[57] ABSTRACT

Terminations (10, 40, 70, 90) for flexible printed circuitry comprises thermosetting epoxy or polyimide prepreg sheets (36, 56, 64, 88, 102) in the rigid portion, instead of thermoplastic acrylic adhesive, partial coverlays (20, 50, 84, 94) instead of full coverlays and, as desired, rigidized members of epoxy or polyimide glass (16, 52, 54, 86) or prepreg internally as well as externally of the terminations. Anchor pads 34 secured to plated-through holes (38) minimize z-axis expansion of the terminations.

23 Claims, 8 Drawing Sheets

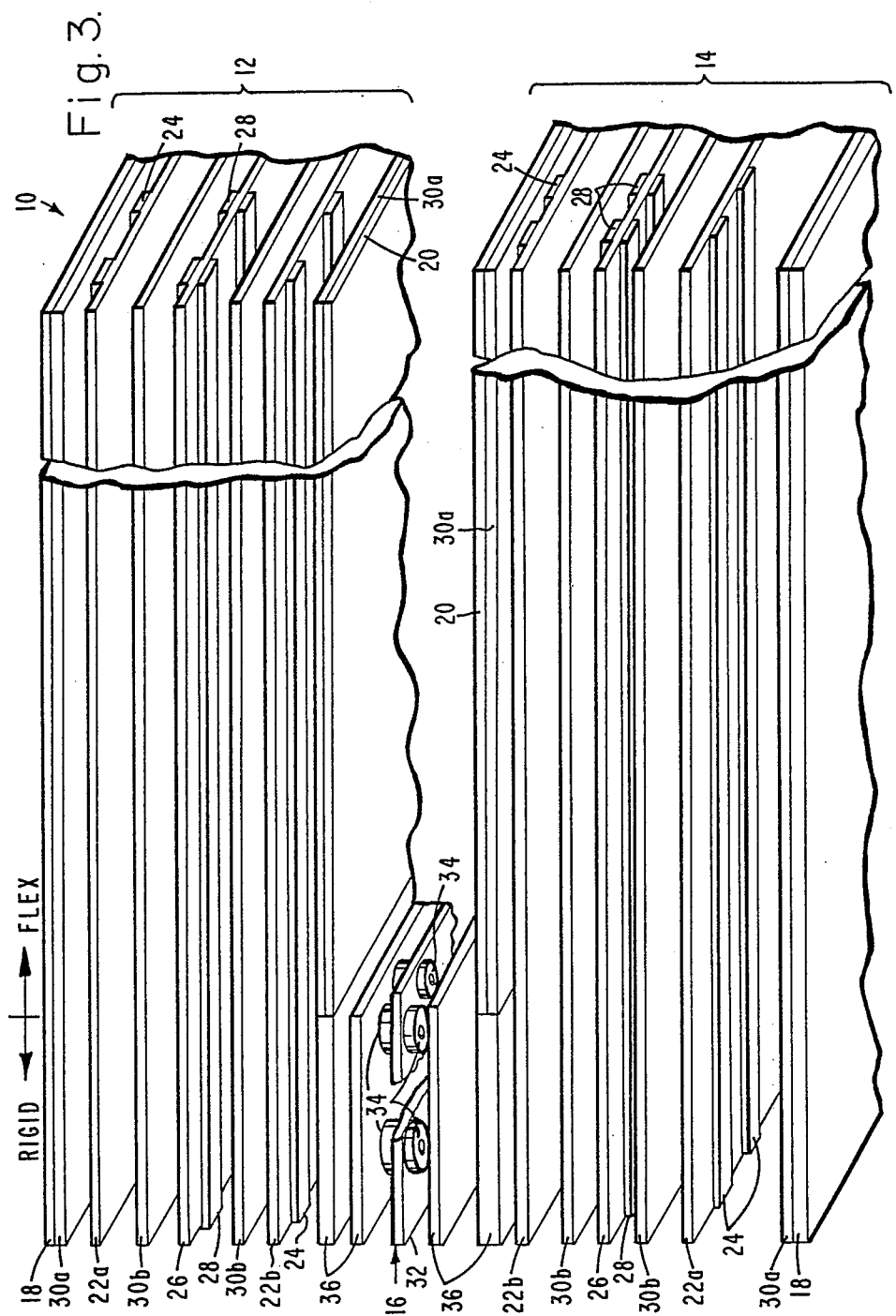

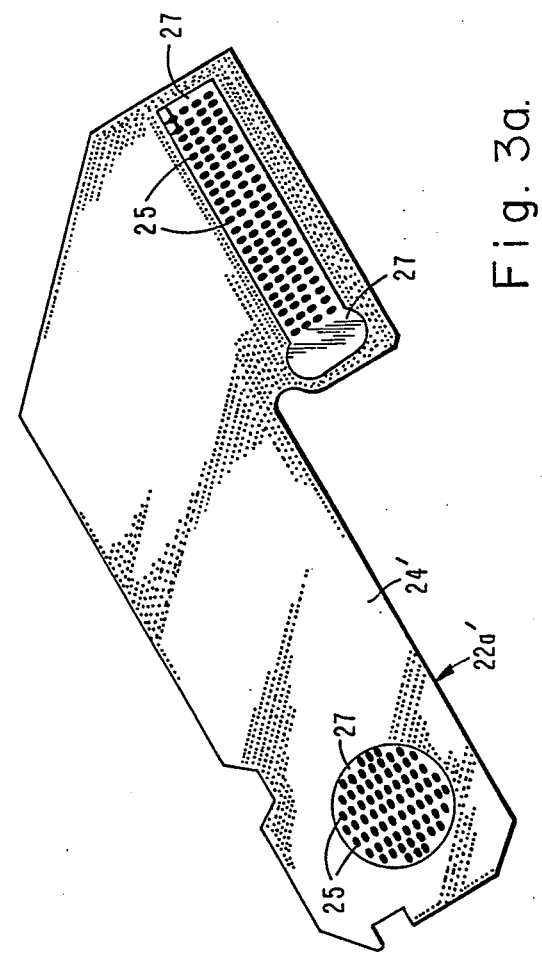

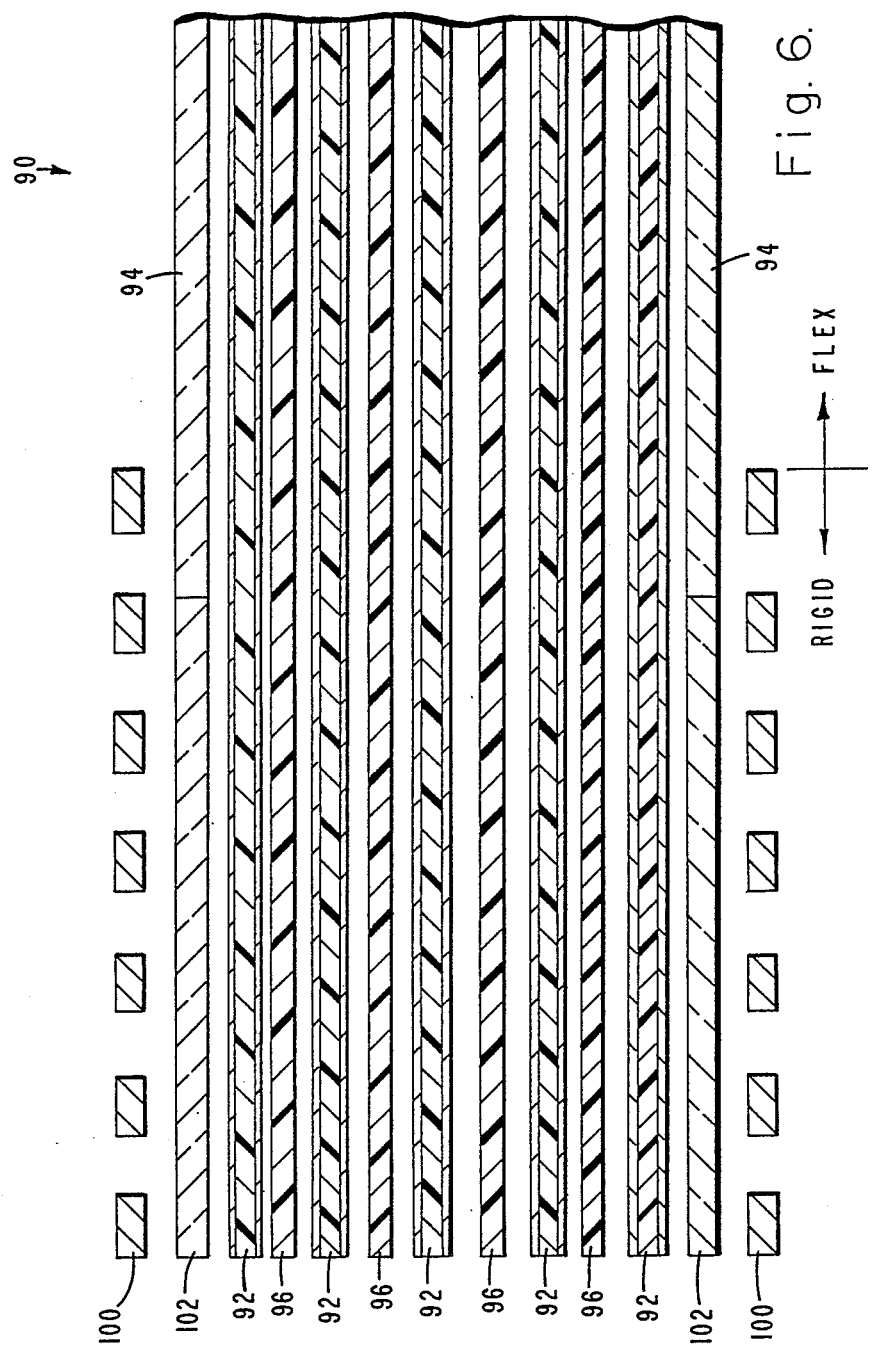

CIRCUIT TERMINATIONS HAVING IMPROVED ELECTRICAL AND STRUCTURAL INTEGRITY

BACKGROUND OF THE INVENTION

The present invention relates to a termination for an electrical circuit with improved electrical and structural integrity.

Electrical connections between and amongst electrical components include the use of flexible cables and circuits whose termination areas, including plated-through holes and other interconnections with the components, are often made more rigid relative to the other portions of the cables or circuits. Such flexible printed wiring includes layers of electrical insulation and conductive leads bonded thereto. For military, aerospace and other high technology applications the electrical insulation typically comprises a polyimide film identified, for example, by the trademark Kapton, although other dielectric films, such as fluorinated ethylene polymer (FEP), are used. A polyimide is generally preferred (although FEP has a slightly higher service temperature than polyimide e.g., between −200° C. to 300° C.), because of its higher tensile strength, lower thermal coefficient of expansion and higher dielectric strength.

Also, even though FEP can be bonded to itself while a polyimide has no adhesive properties of its own, a polyimide is still preferred. Accordingly, a polyimide must be coated with an adhesive, which typically comprises an acrylic based compound. The metallic leads, usually formed from copper foil, are also adhesively bonded to the dielectric film by the acrylic based compound.

Thus, a conventional flexible printed circuit may comprise a centrally positioned copper-clad Kapton sheet which is sandwiched between two Kapton coversheets, sometimes termed "coverlays." Bonding is by an acrylic adhesive. Depending upon electrical interconnection requirements, generally a plurality of such sandwiched flexible printed circuits are combined in which the copper cladding comprise combinations of signal, power and shield conductors.

Flexible printed circuits are terminated by bonding one or more such layers together along with rigidizing members, and the whole becomes an integral bonded-together unit. A typical rigidizing member comprises layers of copper clad polyimide glass placed on the external surfaces of the printed circuitry, and the whole is bonded together by an acrylic adhesive. Thus, a conventional termination includes layers of flexible printed circuitry whose termini are bonded together with acrylic adhesive and layers of polyimide glass bonded to the exposed interfaces of the circuitry also with acrylic adhesive. Plated-through holes interconnect the conductors in the several layers, and electric components are soldered to and within the plated-through holes.

It is important in such constructions that the pads on the external copper clad polyimide glass rigidizig members and all of the conductors of the respective layers of flexible printed circuitry be aligned to ensure that electrical connections amongst the layers of circuitry in fact exist. The requirement, that these layers be accurately aligned so that the plated through holes can make effective electrical connections, has dictated the use of extremely accurate and sophisticated registration tooling. The almost universal use of precision plotters for multi layer artwork generation and of numerically controlled drills for multi layer board drilling is an outgrowth of these requirements. The outer layer circuit patterns are plated with a tin-lead alloy, and then fused to provide a readily solderable surface with good storage characteristics. It is preferred that the outer layers contain only pads or lands and no conductors.

One major difficulty encountered with such terminations of flexible printed wiring combinations lies with the use of acrylic adhesive. As distinguished from polyimide materials, which are thermosetting, acrylic adhesives do not cure but remain thermoplastic; therefore, they remain rubbery and are not rigid. However, acrylic adhesives are used as distinguished from other materials because they are flexible, have good dielectric characteristics, are resistant to solvents, do not flow under pressure, and remain stable between −50° C. through 215° C., which are the minimum temperature requirements for military and some aerospace applications. The disadvantages of acrylic adhesives are due to their thermoplastic properties.

Specifically, because acrylic adhesives do not set, they provide a medium by which the lands of the polyimide layers they join might move horizontally with two degrees of freedom in an x-y direction. Such movement produces vertical misalignment among the conductors and pads in the several layers, and results in poor or no interconnections. Further, acrylic tends to expand with a rise in temperature, which increases the thickness of the joined together layers, and exerts tension on the plated through holes which separate and break the vertical or "z axis" interconnections.

A further problem is that acrylic adhesives as well as the polyimide layers smear when holes are drilled through the terminations prior to being plated with copper and this smear must be removed prior to the plating. When the holes are drilled through the assembly to expose copper of the conductors at all points where lands are to be located, whether internal or external, the drilling smears the otherwise exposed copper with the plastic layers and adhesives, especially when the temperature of the drill bit at the cutting interface in the hole rises above the glass transition temperature ($T_5$) or the plastic temperature range of the plastic and thus leaves an insulating layer on the drilled through copper conductors. Such smear is removed before the plating process by an acid solution or, preferably, by a plasma etch. Typically, the circuit is first baked for approximately 3-8 hours, and followed by a plasma etching for about 20 minutes.

One further problem with conventional termination process is the need to place a circuit within a pouch when the termination is chemically etched. This "pouching" protects already completed portions from being etched, and must be carefully performed.

Still another problem, related to the flexibility of the cable, is the use of solid conductors for shielding purposes. Such conductors typically have a 1.4 mil (3.56 microns) thickness and as a result are not sufficiently flexible.

SUMMARY OF THE INVENTION

These and other problems are successfully addressed and overcome in the present invention by eliminating as much acrylic adhesive material as is possible, while maintaining rigidity of the termination. Thus, a thermosetting adhesive is used in the rigid termination instead of an acrylic adhesive, partial coverlay sheets are employed instead of full cover sheets further to avoid use of an acrylic adhesive, and the flexible printed circuitry may be rigidized in its interior as well as on its exterior. In addition, internal anchoring pads which are mechanically and electrically secured to plated-through holes stabilize the circuitry and minimize z-axis expansion. The anchoring pads may be selectively electrically interconnected to provide internal bussing. A perforated shielding covering the entire surface area of a dielectric sheet is preferably used instead of solid shielding.

Several advantages are derived from the above construction. By using a thermosetting adhesive instead of a thermoplastic acrylic adhesive, and adding internal anchor pads, both the horizontal x-y movement and the z-axis expansion of the circuit are substantially decreased, respectively to minimize misalignment of conductors and pads among the several layers and to prevent increase of the circuit thickness with increase in temperature. Thus, substantially complete contact of the conductors is assured and breakage of the plated through holes is avoided.

The partial coverlay of polyimide material in the flexible portion of the circuit is joined in the same plane with the thermosetting adhesive to form a single sheet, further to minimize use of the acrylic adhesive and to lessen the overall thickness of the circuit. External rigidizing members, used in conventional flexible printed circuitry design, which usually comprise copper clad multilayered polyimide glass and which require significant amounts of acrylic adhesive for their bonding to the flexible members, are replaced by a new rigidizing member, for example, of "prepreg" comprising epoxy or polyimide fiberglass with thermosetting adhesive. "Prepreg" sheets comprise woven glass cloth impregnated with resin of polyimide or epoxy, for example, in liquid form, which is partially cured to a tack-free condition (B-stage) by controlled heat exposure. When such woven glass cloth with partially cured resin is cut into sheets, it is called "prepreg." The new rigidizing member is thinner than the multilayered polyimide glass layer and can be placed anywhere within the circuit termination, whether exterior or interior.

Also, by substantially reducing the amount of acrylic adhesive, less drill smear is produced. Thus, the baking operation prior to the plasma etch process has been decreased from the former 3–8 hours to 15 minutes and the plasma etch process has been decreased from 20 minutes to 5 minutes.

Another advantage of the present invention is that the "pouching" process is omitted whereby a pouch is used to protect already completed circuitry from further chemical processing, in particular when the rigidized members are placed internally of the construction and, therefore, are already encapsulated and protected.

Use of perforated shielding permits thinner conductor to be used than for solid shielding, thus enhancing the flexibility of the flexible circuit while maintaining equivalent electrical shielding.

By use of the present invention, circuit terminations can withstand thermal stresses of 20 seconds at 290° C. in comparison to thermal stresses exerted on conventional circuit parameters, for example, of 10 seconds at 260° C.

Other aims and advantages, as well as a more complete understanding of the present invention, will appear from the following explanation of exemplary embodiments and the accompanying drawings thereof.

DESCRIPTION OF THE DRAWINGS

FIG. 3 is an exploded cross-sectional view of the circuit shown in FIG. 2, prior to placement of the plated-through holes or feed throughs in the circuit, illustrating a rigid to flex construction formed in accordance with a first embodiment of the present invention in which a stiffener layer is placed centrally within the circuit;

FIG. 3a is a preferred embodiment of perforate shielding rather than solid shielding for added flexibility; and FIGS. 4–6 depict exploded cross sectional views of further embodiments of the present invention showing alternate placements of a plurality of stiffener layers.

DETAILED DESCRIPTION OF THE PREFERRED EMBODIMENTS

Figure 1:
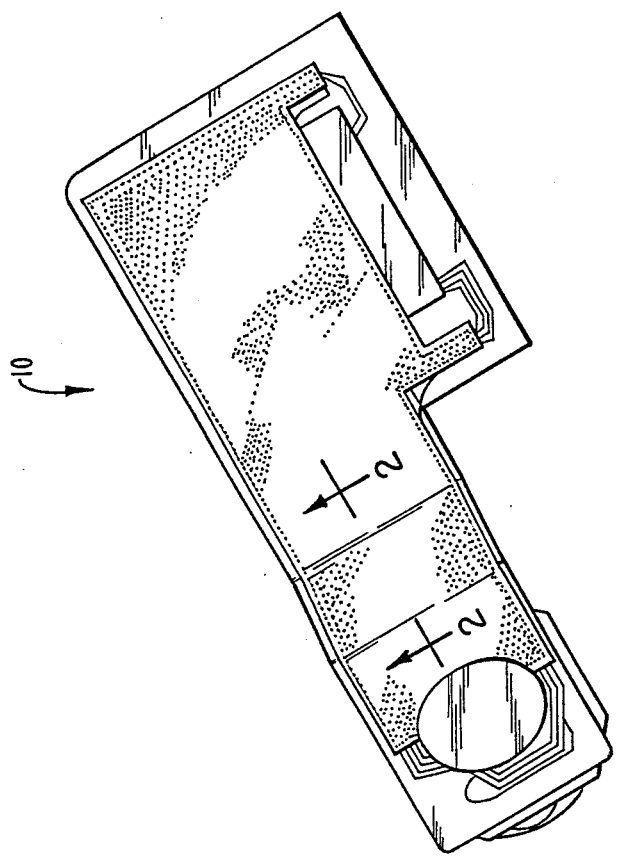
FIG. 1 is a perspective view of a flexible circuit or harness incorporating the present invention.
Figure 2:
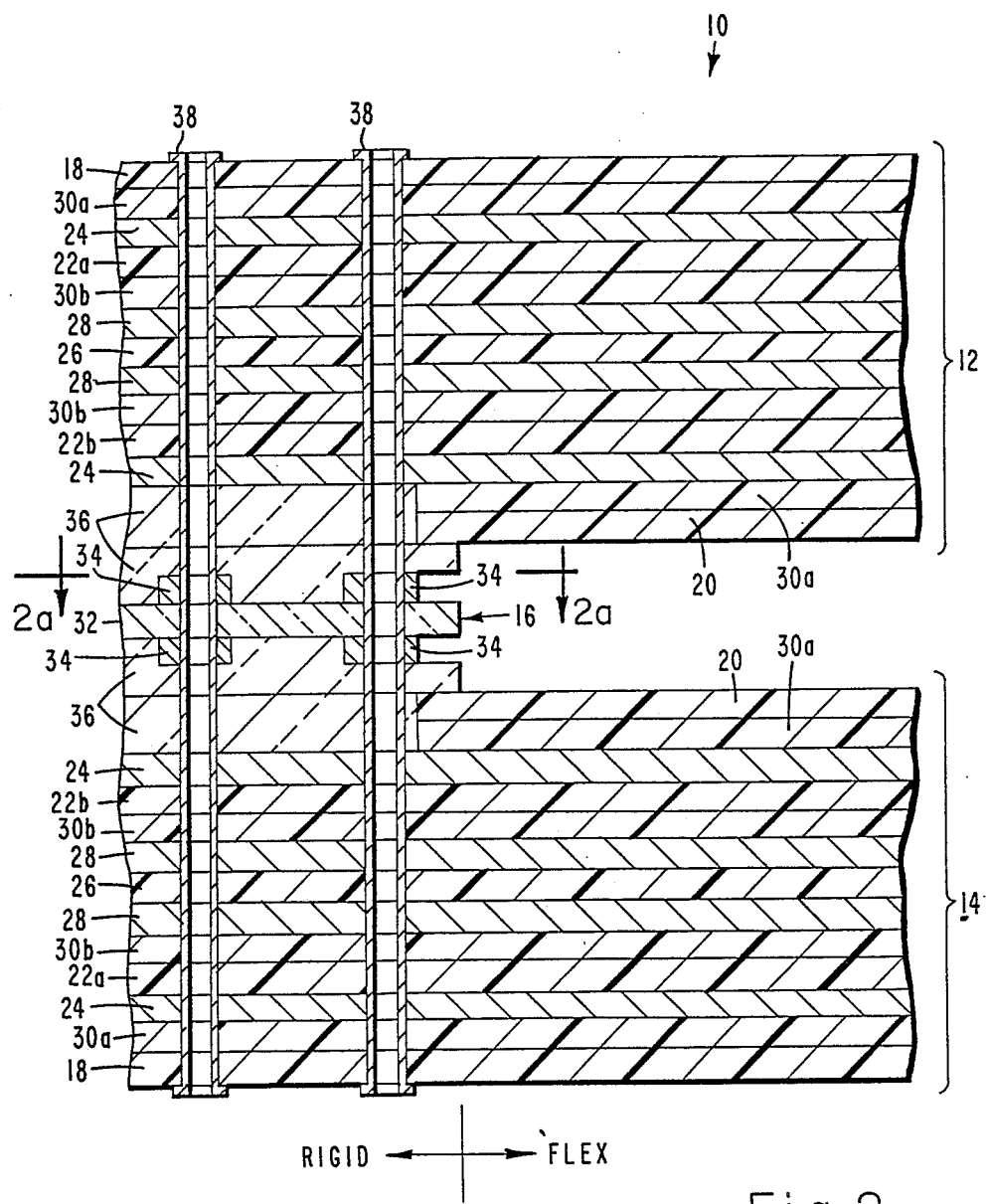
FIG. 2 is a view of the circuit of FIG. 1, taken along line 2—2 thereof, with feed throughs or plated through holes extending through the circuit layers, showing a multi-level interconnection of the leads in the layers.

As shown in FIGS. 1 through 3, a flexible printed circuit or cable 10 comprises a pair of preassembled layers 12 and 14 bonded to a central stiffener core 16. Each layer 12 and 14 comprises respective outer and inner external coverlay sheets 18 and 20 of polyimide film, shield sheets 22a and 22b of polyimide film with copper conductors 24 thereon, a sheet 26 of polyimide film with copper conductors 28 thereon and acrylic adhesive 30a and 30b respectively bonded to sheets 18 and 20 and existing as unsupported sheets between respective shields 22a and 22b and sheet 26 Layers 12 and 14 are assembled in a conventional manner as is known in the art, except that inner external coverlay sheets 20 are terminated short of the ends of layers 12 and 14, as distinguished from outer external coverlay sheet 18 which extends to the full end of the preassembled layer. As will be described hereinafter, sheet 18 for each layer is applied after the remainder of layers 12 and 14 have been assembled.

Figure 2A:
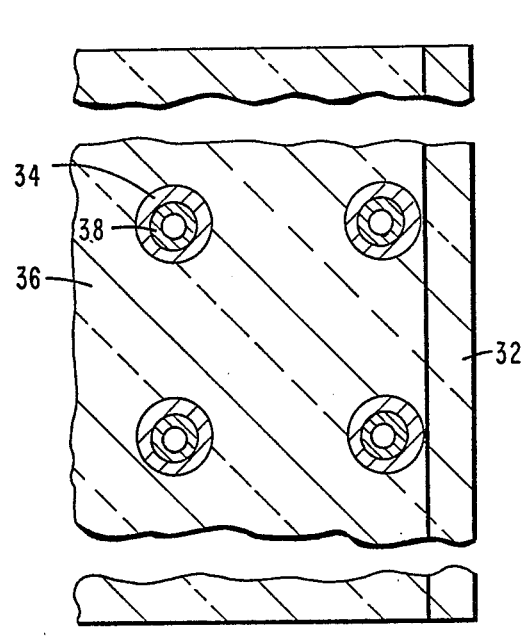
FIG. 2a is a view of anchoring pads taken along line 2a—2a of FIG.2.

Stiffener core 16 comprises a base, for example, of epoxy or polyimide glass 32 having annular or washer-like copper anchor pads 34 (see FIG. 2a) bonded thereto. Core 16 is bonded to its respective layers 12 and 14 by adhesive "prepreg" sheets 36. As stated before, "prepreg" sheets comprise woven glass cloth impregnated with resin of polyimide or epoxy, for example, in liquid form, which is partially cured to a tack free condition (B stage) by controlled heat exposure. When such woven glass cloth with partially cured resin is cut into sheets, it is called "prepreg."

Figure 2B:
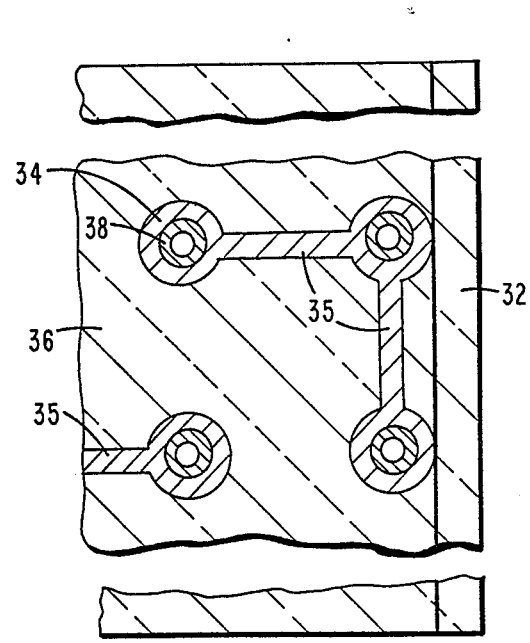
FIG. 2b is a view similar to that of FIG. 2a, but illustrating a modification in which electrical interconnections are added to interconnect selected ones of the anchoring pads to provide internal bussing.

Anchor pads 34 may also be used for internal electrical connections or bussing, as shown in FIG. 2b. In this modification, interconnections 35 electrically interconnect one or more pads 34.

When layers 12 and 14 are assembled together with stiffener core 16 and its prepreg sheets 36, and their respective conductors or pads 24, 28 and 34 are properly aligned, the three components of layers 12 and 14 and core 16 are suitably laminated together, and the partially cured resin in prepreg sheets is cured to form a bonded together rigid termination for cable layers 12 and 14. This laminated construction then has the appearance as shown in FIG. 2.

Thereafter, holes are appropriately drilled through the reinforced termination and are etched to remove smear, and copper is electrolessly deposited and electroplated within the holes to produce plated-through holes 38. Anchor pads 34 serve the important and novel purpose of minimizing z-axis expansion. Such minimization of expansion occurs because, as shown for example in FIG. 2, the anchor pads have a greater cross-section than that of the plated through holes to which they are secured, and thus extend from the plated-through holes into the relatively rigid dielectric material to anchor the plated-through holes to the circuit terminations.

In the configuration depicted in FIGS. 2 and 3, electrical conductors 24 are used as shields to prevent cross talk between signal carrying conductors in or exterior to layers 12 and 14. Shields 24 may be formed from 1 ounce per square foot (1.4 mil or about 3.56 micron) thick copper. To improve flexibility, as illustrated in FIG. 3a, shields 24 may be replaced by a perforated shield 24' of ½ ounce per square foot (0.7 mil or about 1.28 micron) thick copper, which extends continuously across the entire breadth and length of its supporting polyimide layer 22a'. Because perforated shield 24' is both perforated and one half the thickness of shields 24, it is considerably more flexible than the latter while, at the same time, having at least the same area and equivalent shielding capability. As shown in FIG. 3a, this construction further permits the use of feed-through pads 25 which are useful, like anchor pads 34 as discussed above, to minimize z-axis expansion. Pads 25 reside within islands 27 positioned within perforated shield 24'.

As an example, a specific cable depicted in FIGS. 2 and 3 is fabricated as follows. Epoxy and polyimide sheets fully covered on one or both sides with copper foil were obtained from a manufacturer. To fabricate epoxy sheets 16 with copper pads thereon and polyimide sheets 22b and 26 with copper leads thereon, the copper foil fully covering the polyimide supporting material as received from the manufacturer was coated with photoresist and registration holes were punched therein. The photoresist was covered with a pattern defining electrical conductors and exposed and developed. The exposed copper on the sheets was chemically etched to define the conductive patterns, whether configured as pads, a shield or conductors, after which the photoresist was stripped and the sheets were cleaned and dried.

To improve adhesion, the exposed copper conductive patterns were first subjected to an acidic micro-etch and then treated with a brown oxide preparation at an operating temperature of 110° F.–135° F. (38° C.–57° C.) for 2 to 4 minutes. A preferred brown oxide preparation comprises a mixture of deionized water and two starting solutions. The first is 50% sulfuric acid ($H_2SO_4$), 0.1N sodium thiosulfate ($Na_2S_2O_3$) solution, 0.5% starch solution and 100 gpl (grams per liter) potassium iodide (KI) solution. The second is 1.0N sulfuric acid. The two starting solutions are combined to include 40% by volume of the first solution, 2.5% by volume of the second solution and the remainder by volume of deionized water. The acidic micro-etch preparation was used to produce a uniform fine-grained copper surface and was obtained by use of the following steps. The exposed copper conductive patterns were first exposed to a 10% by volume sulfuric acid rinse, followed by a warm deionized water rinse. The resulting surface obtained needed to be a water break-free surface, that is, the surface had to be free from oil or other contamination.

Each of layers 12 and 14 were formed as two separate laminations using acrylic adhesive 30a and 30b as the bonding agent. The laminating process was performed by conventional techniques. Each subassembly therefore comprises sheets 22a, 26, 22b, and 20 but outer external coverlay sheets 18 were not yet secured to shields 22a. Tooling holes were then drilled in the subassemblies and the two subassemblies were laminated together with stiffener core 16 and adhesive sheets 36.

The lamination process for combining the two subassemblies with stiffener core 16 was performed in two steps. In the first, the three parts comprising subassemblies 12 and 14 and core 16 were aligned and lightly pressed together to form an initial bonding. It is at this point where the glass transition (Tg) occurs, that is, where the B stage prepreg material chances from a liquid to a solid state. The pressure is then increased to about 250 psi (17.5 kg/cm²) at 340° F. (171° C.) for about 1 hour.

Holes were drilled into both the two subassemblies and separately into outer external coverlay sheets 18. Respective holes in the assemblies and the layers were plasma etched. In the same manner as described above to form the dielectric sheets with pads and leads, the sheets with copper foil, as obtained from their manufacturer, were processed as follows. The exposed copper foil on outer layers 22a of the assemblies were coated with photoresist, a pattern defining positions of pads and plated through holes was placed thereover, and the resist was exposed and developed. The total assembly was placed in an electroless copper bath so that copper was coated both on the exposed copper and any exposed dielectric material within the holes. The exposed areas were then electrolytically plated with copper and soldered. The photoresist was then stripped from outer sheets 22a, which were then coated with another photoresist layer to define the final pad and shielding pattern. A circuit pattern for the final pads and the shielding was placed on the photoresist, and the photoresist was exposed and developed. The exposed copper was chemically milled, using both the photoresist and the solder as resist material. The photoresist was stripped therefrom and the assembly was cleaned.

Predrilled outer exterior coverlay sheets 18 were then laminated to the assembly using acrylic adhesive 30a. All solder was reflowed by immersing the assembly in a hot oil bath, and the final assembly was routed.

Figure 4:
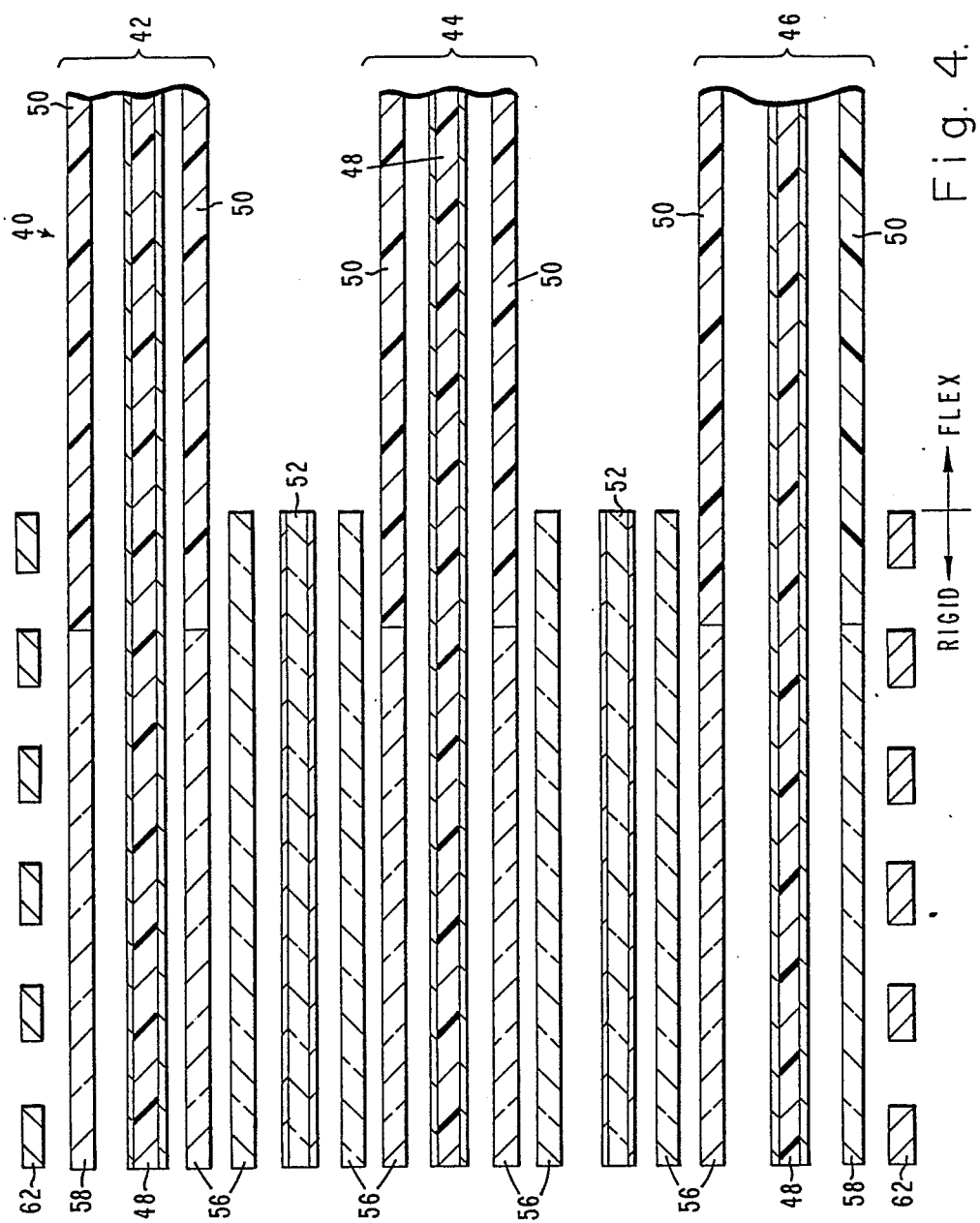

FIG. 4 illustrates a modified flexible electric cable 40. Cable 40 comprises preassembled layers 42, 44 and 46, each including copper clad polyimide sheets 48 and partial polyimide coverlay sheets 50. Internal stiffener cores 52 are bonded respectively between layers 42 and 44, and between layers 44 and 46 by prepreg sheets 56. Cable 40 is completed by outer sheets 58 having pads 62 of conductive material of copper thereon, and all three sheets 48 are bonded by further prepreg sheets 56 to partial polyimide coverlays 50, which are on the exterior of sheets 48 of layers 42, 44 and 46.

Figure 5:
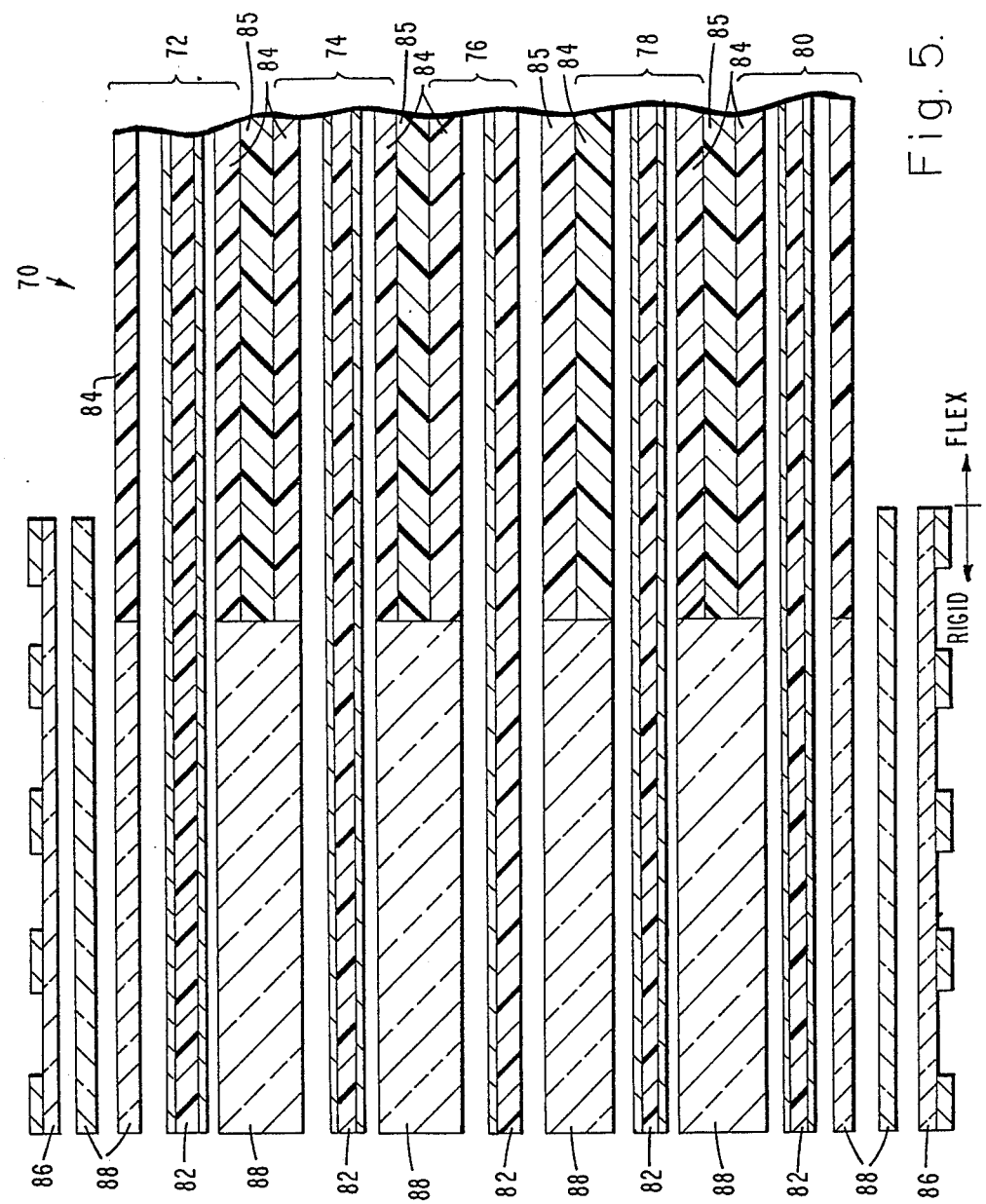

A third embodiment, shown in FIG. 5, comprises a cable 70 having preassembled layers 72, 74, 76, 78 and 80. Each of the layers comprises a two sided copper clad polyimide sheet 82, with the exception of single-sided sheet 82' in layer 76, partial polyimide coverlay sheets 84, and an acrylic adhesive 85. Copper clad epoxy glass stiffener cores 86 are bonded to layers 72 and 80, and the remaining layers are bonded together by prepreg sheets 88.

FIG. 6 illustrates a further embodiment comprising a cable 90. Cable 90 includes copper clad polyimide sheets 92, partial polyimide coverlay sheets 94, adhesive acrylic material 96, and outer prepreg sheets 102 with pads or lands 100 thereon. Prepreg sheets 102 bond pads or lands 100 to copper clad polyimide sheets 92 and, in this embodiment, form the sole stiffening medium for cable 90.

Although the invention has been described with respect to particular embodiments thereof, it should be realized that various changes and modifications may be made therein without departing from the spirit and scope of the invention.

What is claimed is:

1. A termination for an electrical circuit with improved electrical and structural integrity comprising:
   joined layers of electrically insulating and conductive material; and
   at least one layer including a stiffener material of thermosetting composition,
   said layers of electrically insulating and conductive materials and said stiffener material layer including at least one substantially planarly arranged longitudinally extending layer consisting of a prepreg sheet and a coverlay sheet.

2. A circuit termination according to claim 1 in which said thermosetting composition includes fiber glass and epoxy resin.

3. A circuit termination according to claim 1 in which said thermosetting composition includes polyimide material.

4. A circuit termination according to claim 1 in which said thermosetting composition includes at least one prepreg sheet.

5. A termination for an electrical circuit with improved electrical and structural integrity comprising:
   joined layers of electrically insulating and conductive material;
   at least one layer including a stiffener material of thermosetting composition;
   plated-through holes extending through said layers; and
   anchor pads placed internally within the terminations and between said layers, and bonded to and extending outwardly from said plated-through holes for minimizing z-axis expansion of said joined layers.

6. A circuit termination according to claim 5 further including interconnections connecting selected ones of said anchor pads.

7. A termination for an electrical circuit with improved electrical and structural integrity comprising:
   joined layers of electrically insulating and conductive material; and
   at least one layer including a stiffener material of thermosetting composition,
   said layers of electrically insulating and conductive material comprising a dielectric layer and conductive material including a perforated section secured to and extending substantially continuously across the entire breadth and length of said dielectric layer.

8. A circuit termination according to claim 7 in which said conductive material further includes anchor pads adjacent to said perforated section, and plated-through holes extending through the layers and bonded to the anchor pads for minimizing z-axis expansion of said joined layers.

9. A circuit termination according to claim 8 further including additional anchor pads placed internally within the circuit and between the layers and bonded also to said additional anchor pads for minimizing z-axis expansion of said joined layers.

10. A termination for a flat electrical circuit comprising layers of electrically insulating and conductive material and including a dielectric layer and conductive material including a perforated section secured to and extending substantially continuously across the entire breadth and length of said dielectric layer.

11. A circuit termination of a lamination of electrically insulating and conductive material comprising plated-through holes extending through the lamination and anchor pads placed internally of the lamination and bonded to and extending outwardly from said plated-through holes for minimizing z-axis expansion of the lamination.

12. A circuit termination according to claim 11 further including interconnections connecting selected ones of said anchor pads.

13. A method for fabricating an electric cable and terminations therefor comprising the steps of:
   providing a layer of electrically insulating and conductive material; and
   bonding a stiffener core including a thermosetting composition to the layer by
      lightly pressing the stiffener core and the layer to a prepreg sheet to form an initial bonding, and
      increasing the pressure under sufficient pressure, temperature and time to complete the bonding.

14. A method according to claim 13 in which the thermosetting composition is selected from the group consisting of polyimide material, a thermosetting resin and a prepreg.

15. A method according to claim 14 in which the prepreg is selected from the group consisting of a fiber glass and epoxy resin composite and a fiber glass and polyimide resin composite.

16. A method according to claim 13 further comprising:
   the pre-bonding steps of incorporating pads of electrically conductive material in the core and the layer and aligning selected ones of the layer and core pads; and
   the post-bonding steps of forming plated-through holes in the layer and the core and the electrically conductive pads therein, and bonding the plated-through holes to aligned ones of the electrically conductive pads.

17. A method according to claim 16 in which said pad incorporating step includes the step of providing interconnections among selected ones of the pads in the core.

18. A method according to claim 16 in which said layer providing step includes the step of providing an electric shield on a sheet of dielectric material, said shield providing step comprising the steps of placing a perforated shield of electrically conductive material over substantially the entire breadth and width of the dielectric sheet.

19. A method according to claim 18 in which said shield providing step further comprises the steps of:

incorporating pads of electrically conductive material within electrically insulated islands surrounded by the perforated sheet in alignment with selected ones of the layer and core pads; and bonding the shield pads to selected ones of the plated-through holes.

20. A method according to claim 18 in which said shield providing step further comprises the step of incorporating pads of electrically conductive material within electrically insulated islands surrounded by the perforated sheet.

21. A method for fabricating an electric cable and terminations therefor comprising the steps of:

placing a perforated shield of electrically conductive material over substantially the entire breadth and width of a dielectric sheet to form a layer therefrom; and bonding a stiffener core including a thermosetting composition to the layer.

22. A method according to claim 21 in which the thermosetting composition is selected from the group consisting of polyimide material, a thermosetting resin and a prepreg.

23. A method according to claim 22 in which the prepreg is selected from the group consisting of a fiber glass and epoxy resin composite and a fiber glass and polyimide resin composite.

* * * * *